US 9,429,806 B2

(12) United States Patent
Yang et al.

(10) Patent No.: US 9,429,806 B2
(45) Date of Patent: Aug. 30, 2016

(54) DISPLAY DEVICE

(71) Applicant: InnoLux Corporation, Miao-Li County (TW)

(72) Inventors: Shun-Chen Yang, Miao-Li County (TW); Ying-Tong Lin, Miao-Li County (TW); Yu-Lun Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/665,086

(22) Filed: Mar. 23, 2015

(65) Prior Publication Data

US 2016/0170275 A1    Jun. 16, 2016

(30) Foreign Application Priority Data

Dec. 15, 2014 (TW) .............................. 103143616 A

(51) Int. Cl.
*G02F 1/1362* (2006.01)
*H01L 27/12* (2006.01)
*G02F 1/1343* (2006.01)

(52) U.S. Cl.
CPC ... *G02F 1/136286* (2013.01); *G02F 1/134309* (2013.01); *H01L 27/124* (2013.01)

(58) Field of Classification Search
CPC ............. G02F 1/134363; G02F 1/136; G02F 1/1362; G02F 1/136286; G02F 1/133707; G02F 1/136213; G02F 1/1368; G02F 1/136227; G02F 1/134309; G02F 1/134336; G02F 1/133345; G02F 1/1345; G02F 1/1343; G02F 1/13452; G02F 2001/134318; G02F 2001/134372; G02F 2001/134345; G02F 2201/123; G02F 2201/124; H01L 27/3262; G09G 3/3648; G09G 3/3677; G09G 3/3688; G09G 2300/0426; G09G 2300/0447; G09G 2320/028
USPC ............. 349/143, 187, 43, 141, 38, 139, 42, 349/138, 146, 145
See application file for complete search history.

(56) References Cited

U.S. PATENT DOCUMENTS 8,208,112 B2 * 6/2012 Tanaka .............. G02F 1/134363
349/139
8,599,349 B2 * 12/2013 Chang .................. G02F 1/1362
349/141

FOREIGN PATENT DOCUMENTS

CN        1178098        12/2004

OTHER PUBLICATIONS

Chinese language office action dated Sep. 10, 2015, issued in application No. TW 103143616.

*Primary Examiner* — Thoi Duong
(74) *Attorney, Agent, or Firm* — McClure, Qualey & Rodack, LLP

(57) ABSTRACT

A display device is provided. The display device includes an array substrate including a substrate and a first electrode having an opening, wherein the opening has an edge. The array substrate further includes a second electrode disposed over the first electrode and including a first finger portion having a first side and a second side opposite to the first side. The second electrode further includes a connection portion connecting the first finger portion at the edge, wherein the connection portion has a first concavity at the first side and a second concavity at the second side, and a length of the first concavity is greater than a length of the second concavity. The display device further includes an opposite substrate and a display medium.

19 Claims, 7 Drawing Sheets

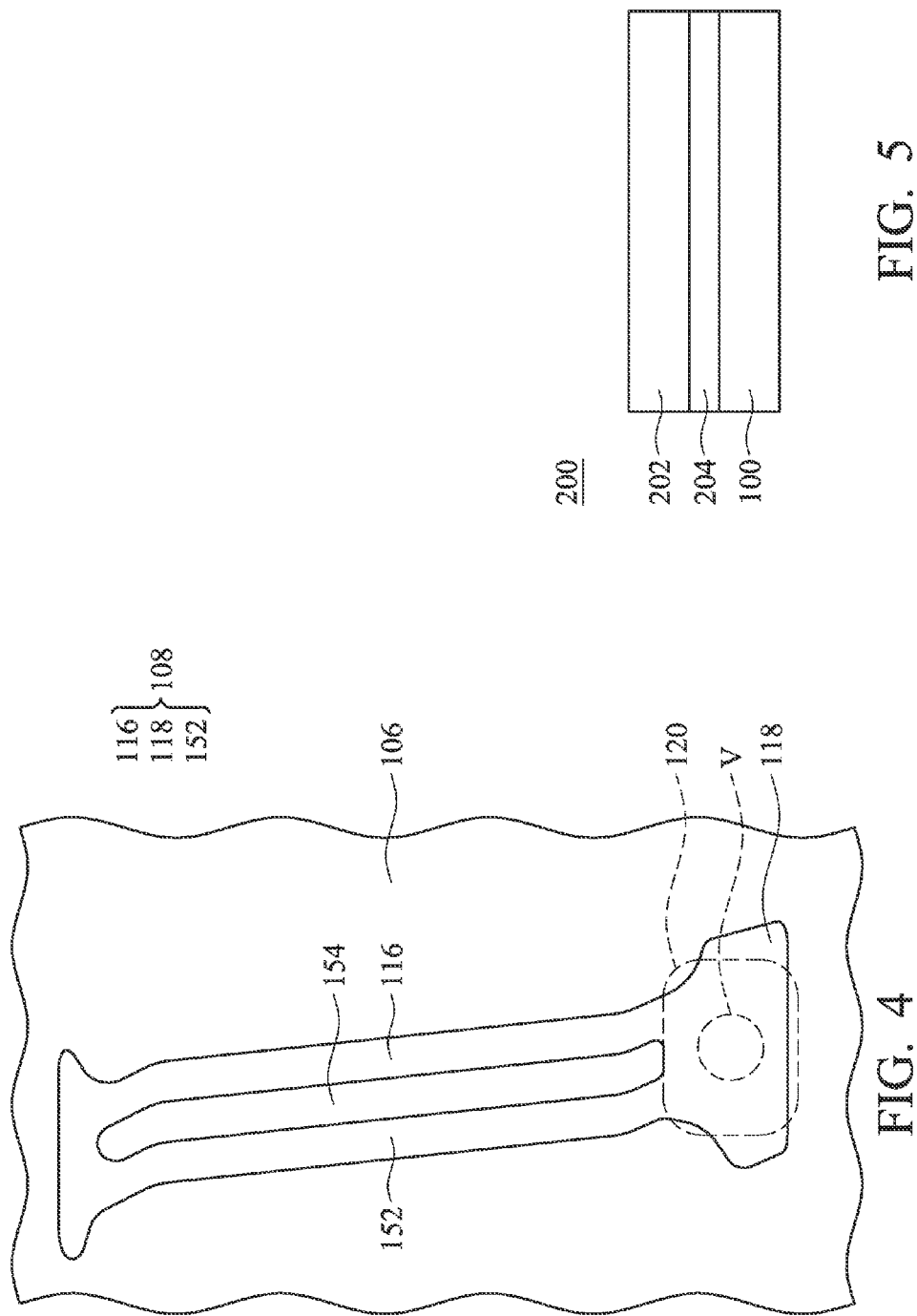

DISPLAY DEVICE

CROSS REFERENCE TO RELATED APPLICATIONS

This application claims priority of Taiwan Patent Application No. 103143616, filed on Dec. 15, 2014, the entirety of which is incorporated by reference herein.

BACKGROUND

1. Technical Field

The disclosure relates to a display device with an array substrate, and in particular to a display device with an electrode having a concavity.

2. Description of the Related Art

Display devices are becoming more widely used in the display elements of various products. Liquid-crystal molecules have different light polarization or light refraction effects at different alignment configurations, and liquid-crystal display devices utilize this characteristic to control light penetration to generate images. Conditional twisted nematic liquid-crystal display devices have good light penetration characteristics. However, they cannot provide a sufficient viewing angle due to the structure and the optical characteristics of the liquid-crystal molecules.

In order to solve this problem, various liquid-crystal display devices with wide-angles and high aperture ratios have been developed, such as an in-plane switching liquid-crystal display device or a fringe-field switching liquid-crystal display device. However, in those liquid-crystal display devices, a few liquid-crystal molecules have an alignment direction that is different from most liquid-crystal molecules, which in turn decreases the liquid-crystal efficiency and the brightness of the display panel when displaying images. In addition, the few liquid-crystal molecules with the different alignment direction would result dark stripe on the display screen. Alternatively, when the display screen is subjected to an external force such as finger contact, the few liquid-crystal molecules with a different alignment direction would result in an unnecessarily bright stripe on the display screen, which detracts from the quality of the display.

Therefore, a display device which may further decrease the amount of the liquid-crystal molecules with a different alignment direction is needed.

SUMMARY

The present disclosure provides a display device, including: an array substrate, including: a substrate; a first electrode disposed over the substrate, wherein the first electrode has an opening and the opening has an edge parallel to a gate-line-extending direction; and a second electrode disposed over the first electrode, wherein the second electrode includes: a first finger portion having a first side and a second side opposite to the first side, wherein a first outer edge of the first finger portion intersects the gate-line-extending direction at an acute angle at the first side, and a second outer edge of the first finger portion intersects the gate-line-extending direction at an obtuse angle at the second side; and a connection portion connecting the first finger portion at the edge, wherein the connection portion has a first width along the gate-line-extending direction adjacent to the edge, and the connection portion has a second width along the gate-line-extending direction away from the edge, wherein the first width is smaller than the second width, wherein the connection portion has a first concavity at the first side and a second concavity at the second side, and a length of the first concavity is greater than a length of the second concavity; an opposite substrate; and a display medium disposed between the array substrate and the opposite substrate.

The present disclosure also provides a display device, including: an array substrate, including: a substrate; a first electrode disposed over the substrate, wherein the first electrode has an opening and the opening has an edge parallel to a gate-line-extending direction; and a second electrode disposed over the first electrode, wherein the second electrode includes: a first finger portion having a first side and a second side opposite to the first side, wherein a first outer edge of the first finger portion intersects the gate-line-extending direction at an acute angle at the first side, and a second outer edge of the first finger portion intersects the gate-line-extending direction at an obtuse angle at the second side; and a connection portion connecting the first finger portion at the edge, wherein the connection portion has a first width along the gate-line-extending direction adjacent to the edge, and the connection portion has a second width along the gate-line-extending direction away from the edge, wherein the first width is smaller than the second width, wherein the connection portion has an first inflection point at the first side and an second inflection point at the second side, wherein a distance between the first inflection point and the edge is greater than a distance between the second inflection point and the edge along a direction perpendicular to the gate-line-extending direction; an opposite substrate; and a display medium disposed between the array substrate and the opposite substrate.

The present disclosure also provides a display device, including: an array substrate, including: a substrate; a first electrode disposed over the substrate, wherein the first electrode has an opening and the opening has an edge parallel to a gate-line-extending direction; and a second electrode disposed over the first electrode, wherein the second electrode includes: a first finger portion having a first side and a second side opposite to the first side, wherein a first outer edge of the first finger portion intersects the gate-line-extending direction at an acute angle at the first side, and a second outer edge of the first finger portion intersects the gate-line-extending direction at an obtuse angle at the second side; and a connection portion connecting the first finger portion at the edge, wherein the connection portion has a first width along the gate-line-extending direction adjacent to the edge, and the connection portion has a second width along the gate-line-extending direction away from the edge, wherein the first width is smaller than the second width, wherein the connection portion has a first concavity at the first side and a second concavity at the second side, wherein a distance between a most-concave point of the first concavity and the edge is greater than a distance between a most-concave point of the second concavity and the edge along a direction perpendicular to the gate-line-extending direction, an opposite substrate; and a display medium disposed between the array substrate and the opposite substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 4 is a top view and a partially enlarged figure of an array substrate in accordance with another embodiment of the present disclosure; and FIG. 5 is a cross-sectional view of a display device in accordance with some embodiments of the present disclosure.

DETAILED DESCRIPTION

Figure 1A:
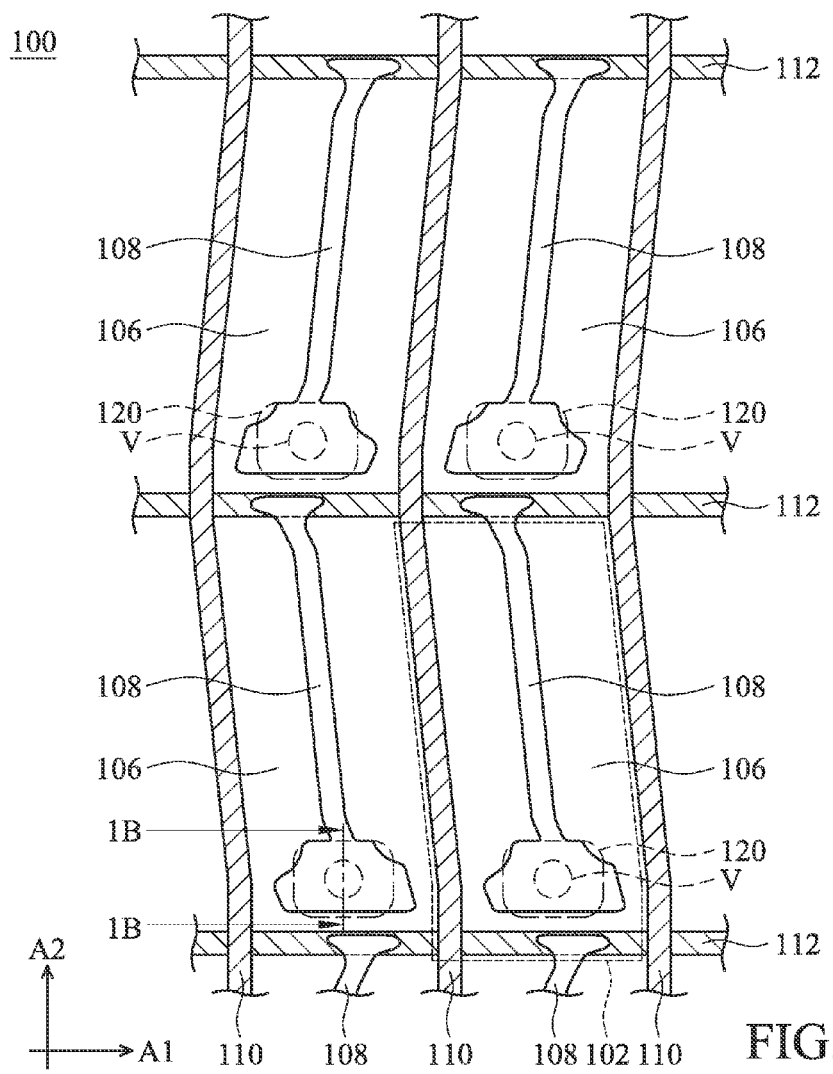
FIG. 1A is a top view of an array substrate in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate the direct contact of the first insulating bump and the second material layer, or it may indicate a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills and the background or the context of the present disclosure, and should not be interpreted in an idealized or overly formal manner unless so defined.

The embodiments of the present disclosure enlarge the concavity of the pixel electrode at specific side to decrease the amount of liquid-crystal molecules having the alignment direction that is different from most liquid-crystal molecules to increase the liquid-crystal efficiency and decrease the bright stripe and the dark stripe.

Figure 1B:
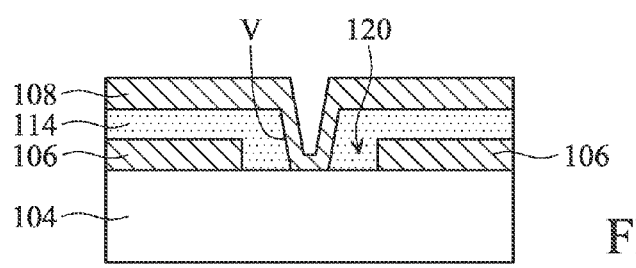
FIG. 1B is a cross-sectional view of an array substrate along line 1B-1B in FIG. 1A in accordance with some embodiments of the present disclosure.

Referring to FIGS. 1A and 1B. FIG. 1A is a top view of an array substrate 100 in accordance with some embodiments of the present disclosure, and FIG. 1B is a cross-sectional view of the array substrate 100 along line 1B-1B in FIG. 1A. The array substrate 100 may be a transistor substrate with a transistor array, such as a thin film transistor substrate. In addition, as illustrated in FIG. 1A, the array substrate 100 has a plurality of sub-pixels 102, and as illustrated in FIG. 1B, the array substrate 100 includes a substrate 104, a first electrode 106 disposed over the substrate 104 and a second electrode 108 disposed over the first electrode 106. It should be noted that, as illustrated in FIG. 1B, the first electrode 106 and second electrode 108 are disposed at different planes. Therefore, the first electrode 106 and second electrode 108 shown in FIG. 1A are projections of these two electrodes on the same plane.

In particular, the substrate 104 may include, but is not limited to, a transparent substrate, such as a glass substrate, a ceramic substrate, a plastic substrate, or any other suitable transparent substrate. In addition, the substrate 104 may further include a data line 110, a gate line 112 (shown in FIG. 1A, but not shown in FIG. 1B) and the aforementioned transistor (not shown). The data line 110 may provide the source signal to the sub-pixels 102, and the gate line 112 may provide the scanning pulse signal to the sub-pixels 102 and control the sub-pixels 102 in coordination with the aforementioned source signal. In addition, the gate line 112 extends along direction A1, and the direction A2 refers to a direction that is substantially perpendicular or orthogonal to the gate-line-extending direction A1.

In addition, the first electrode 106 and second electrode 108 may independently include, but are not limited to, a transparent conductive material such as indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide material. In the embodiment shown in FIG. 1B, the first electrode 106 is a common electrode, and the second electrode 108 is a pixel electrode. In addition, the first electrode 106 which serves as the common electrode is disposed in the entire region of the sub-pixels 102. The first electrode 106 has an opening 120. An insulating layer 114 is disposed between the first electrode 106 and second electrode 108 and is filled into the opening 120 of the first electrode 106. The material of the insulating layer 114 may include, but is not limited to, silicon oxide, silicon nitride, silicon oxynitride, a combination thereof, or any other suitable material.

In addition, a through hole V is disposed in the region of the insulating layer 114 corresponding to the opening 120. The second electrode 108, which serves as a pixel electrode, is electrically connected to the data line 110 (not shown) in the substrate 104 through the through hole V. In other words, as illustrated in the top view of FIG. 1A, the through hole V is disposed in the opening 120. In addition, the insulating layer 114 may electrically insulate the first electrode 106 from the second electrode 108, such that a electric capacity may be formed between the first electrode 106 and the second electrode 108.

Figure 2:
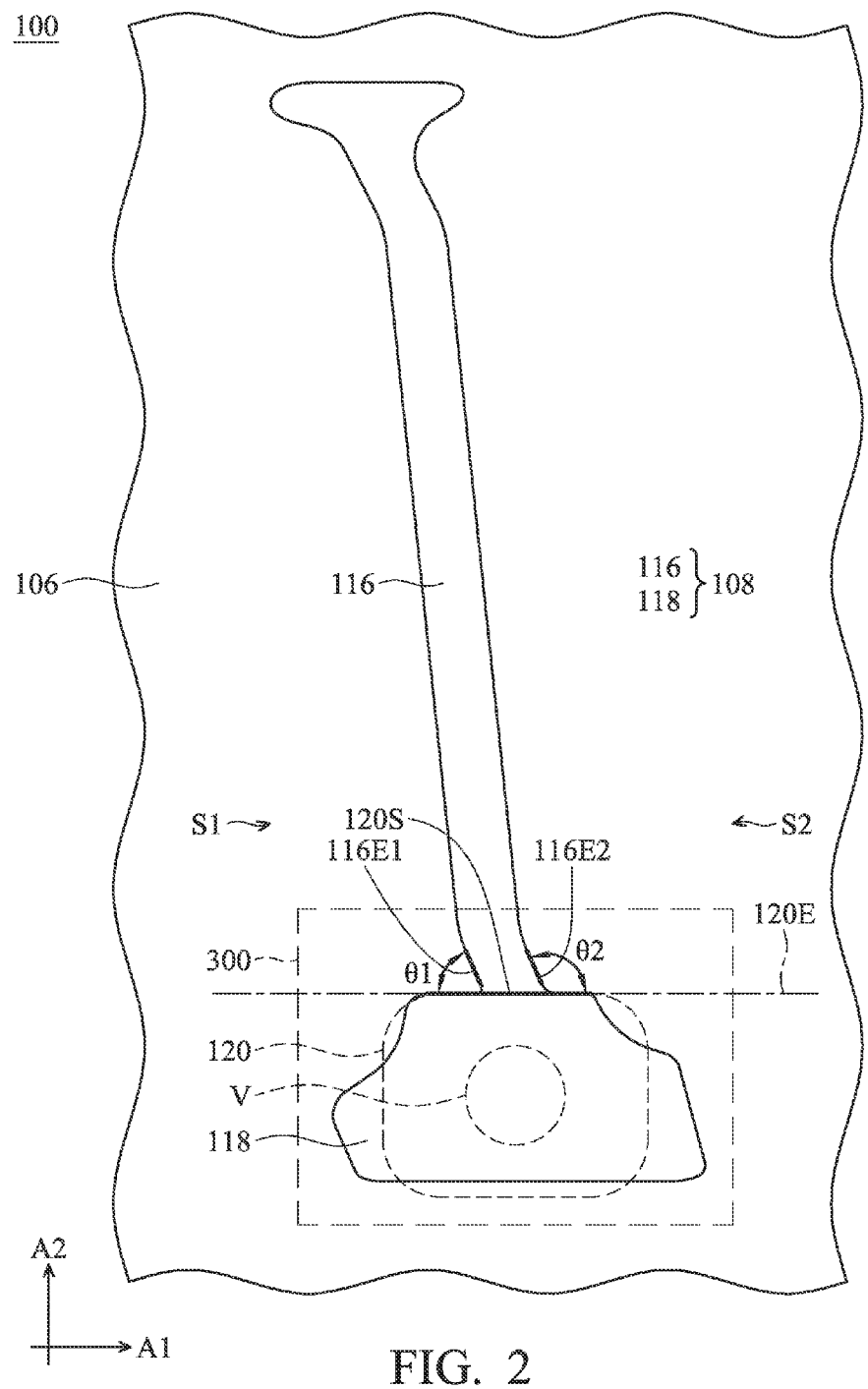
FIG. 2 is a partially enlarged figure of the array substrate in FIG. 1A.

FIG. 2 is a partially enlarged figure of one of the second electrode 108, which serves as a pixel electrode, of the array substrate 100 in FIG. 1A. As illustrated in FIG. 2, the second electrode 108 serving as a pixel electrode includes a first finger portion 116 and a connection portion 118. In addition, the opening 120 has an edge 120S parallel to a gate-line-extending direction A1. In particular, the edge 120S refers to the edge of the opening 120 which is parallel to a gate-line-extending direction A1 and is closer to the first finger portion 116. Namely, the edge 120S is the bold line pointed by reference numeral 120S. In addition, the first finger portion 116 and the connection portion 118 may connect to each other substantially at the edge 120S. In addition, the extension line 120E refers to the line which is parallel to a gate-line-extending direction A1 and substantially overlaps with the edge 120S.

As illustrated in FIG. 2, the first finger portion 116 has a first side S1 and a second side S2 opposite to the first side S1, and the first outer edge 116E1 of the first finger portion 116 intersects the gate-line-extending direction A1 (for example the direction of the extension line 120E) at an acute angle θ1 at the first side S1, and the second outer edge 116E2 of the first finger portion 116 intersects the gate-line-extending direction A1 (for example the direction of the extension line 120E) at an obtuse angle θ2 at the second side S2. In other words, the first side S1 refers to the side where the first outer edge 116E1 of the first finger portion 116 intersects the gate-line-extending direction A1 (for example the direction of the extension line 120E) at the acute angle θ1 at the connection part of the first finger portion 116 and the connection portion 118. The second side S2 refers to the side where the second outer edge 116E2 of the first finger portion 116 intersects the gate-line-extending direction A1 (for example the direction of the extension line 120E) at the obtuse angle θ2 at the connection part of the first finger portion 116 and the connection portion 118.

Figure 3A:
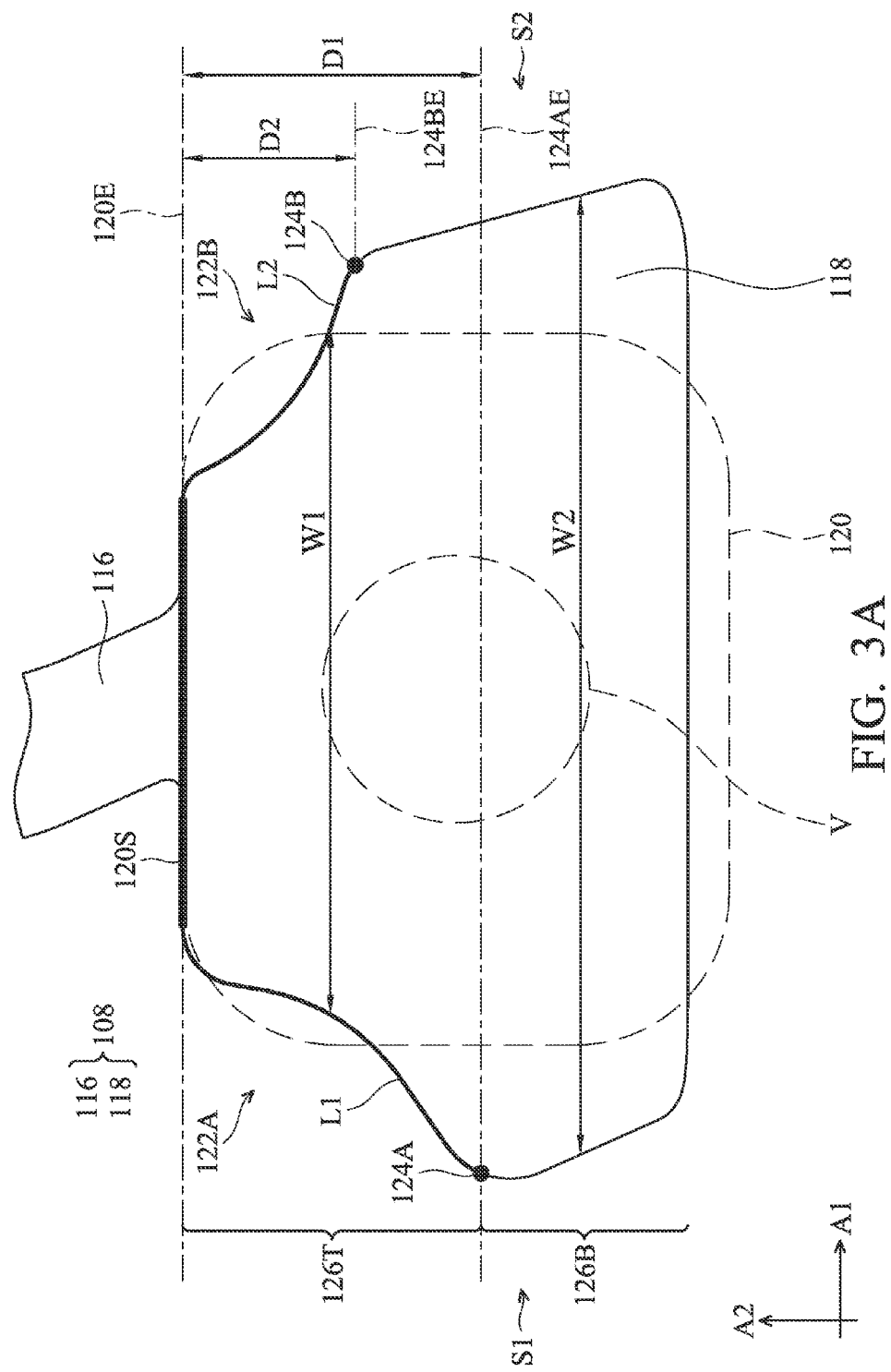
FIG. 3A is a partially enlarged figure of the array substrate in FIG. 2.

FIG. 3A is an enlarged figure of the connection portion 118 and a portion of the first finger portion 116 in FIG. 2; namely, FIG. 3A is an enlarged figure of the region 300 in FIG. 2. As illustrated in FIG. 3A, the connection portion 118 has a first width W1 along the gate-line-extending direction A1 adjacent to the edge 120S, and the connection portion 118 has a second width W2 along the gate-line-extending direction A1 away from the edge 120S. In addition, the first width W1 is smaller than the second width W2.

In particular, the connection portion 118 includes an upper portion 126T adjacent to the edge 120S and a lower portion 126B away from the edge 120S. The upper portion 126T has a first width W1 along the gate-line-extending direction A1, and the lower portion 126B has a second width W2 along the gate-line-extending direction A1.

The upper portion 126T and the lower portion 126B of the connection portion 118 is defined as follows. The connection portion 118 has a first concavity 122A at the first side S1 and a second concavity 122B at the second side S2. The first concavity 122A has a first end point 124A away from the edge 120S, and the second concavity 122B also has a second end point 124B away from the edge 120S. An extension line is made along the gate-line-extending direction A1 with respect to the end point which is chosen from the first end point 124A and the second end point 124B and is farther away from the edge 120S. For example, the extension line 124AE is made with respect to the first end point 124A which is farther away from the edge 120S in FIG. 3A, and the extension line 124AE is parallel to the gate-line-extending direction A1 and passes through the first end point 124A. The extension line (for example the extension line 124AE) separates the connection portion 118 into two portions. The portion which is closer to the edge 120S is the upper portion 126T, and the portion which is farther away from the edge 120S is the lower portion 126B.

In addition, the first width W1 is the width between the first concavity 122A and the second concavity 122B at the upper portion 126T along the gate-line-extending direction A1, and the second width W2 is the width between the opposite sides at the lower portion 126B along the gate-line-extending direction A1.

In addition, the first concavity 122A and the second concavity 122B of the connection portion 118 are disposed merely in the upper portion 126T of the connection portion 118, and are not disposed in the lower portion 126B of the connection portion 118.

Still referring to FIG. 3A, in the connection portion 118 of the present disclosure, the length L1 of the first concavity 122A (namely the length of the bold line labelled as the reference numeral L1 in FIG. 3A) is greater than the length L2 of the second concavity 122B (namely the length of the bold line labelled as the reference numeral L2 in FIG. 3A). This feature may decrease the amount of the liquid-crystal molecules having the alignment direction different from most liquid-crystal molecules to increase the liquid-crystal efficiency and decrease the brightness non-uniformity that deteriorates the display quality.

In particular, the present disclosure defines the first side S1 as the side where the first outer edge 116E1 of the first finger portion 116 intersects the gate-line-extending direction A1 (at the acute angle θ1 at the connection part of the first finger portion 116 and the connection portion 118. The applicant discovered that the portion of the connection portion 118 at the first side S1 would make a portion of the liquid-crystal molecules at the first side S1 have an alignment direction different from most liquid-crystal molecules, which in turn results the brightness non-uniformity of the display quality and decreases the liquid-crystal efficiency. Since the length L1 of the first concavity 122A is greater than the length L2 of the second concavity 122B in the present disclosure, the area of the portion of the connection portion 118 at the first side S1 may be substantially decreased. Therefore, the amount of the liquid-crystal molecules at the first side S1 which have the alignment direction different from most liquid-crystal molecules may be decreased to increase the liquid-crystal efficiency and the brightness of the display panel when displaying images. In addition, the brightness non-uniformity may be reduced to improve the display quality. For example, in one embodiment, the liquid-crystal efficiency of the liquid-crystal molecules in the region corresponding to the first concavity 122A at the first side S1 may be increased from about 20% to 23%.

In addition, in the connection portion 118 of the present disclosure, the distance D1 between the first end point 124A of the first concavity 122A and the edge 120S is greater than the distance D2 between the second end point 124B of the second concavity 122B and the edge 120S.

In particular, in FIG. 3A, the extension line 124AE is the line which is parallel to the gate-line-extending direction A1 and passes through the first end point 124A. The distance D1 between the first end point 124A and the edge 120S refers to the distance between the extension line 124AE and the extension line 120E along the direction A2 which is perpendicular to the gate-line-extending direction A1. Similarly, the extension line 124BE is the line which is parallel to the gate-line-extending direction A1 and passes through the second end point 124B. The distance D2 between the second end point 124B and the edge 120S refers to the distance between the extension line 124BE and the extension line 120E along the direction A2 which is perpendicular to the gate-line-extending direction A1.

As illustrated in FIG. 3A, the distance D1 being greater than the distance D2 means that the area of the portion of the connection portion 118 at the first side S1 is smaller than the area of the portion of the connection portion 118 at the second side S2. Therefore, the amount of the liquid-crystal molecules having the alignment direction different from most liquid-crystal molecules may be decreased to increase the liquid-crystal efficiency and the brightness of the display panel when displaying images and decrease the brightness non-uniformity to improve the display quality.

Figure 3B:
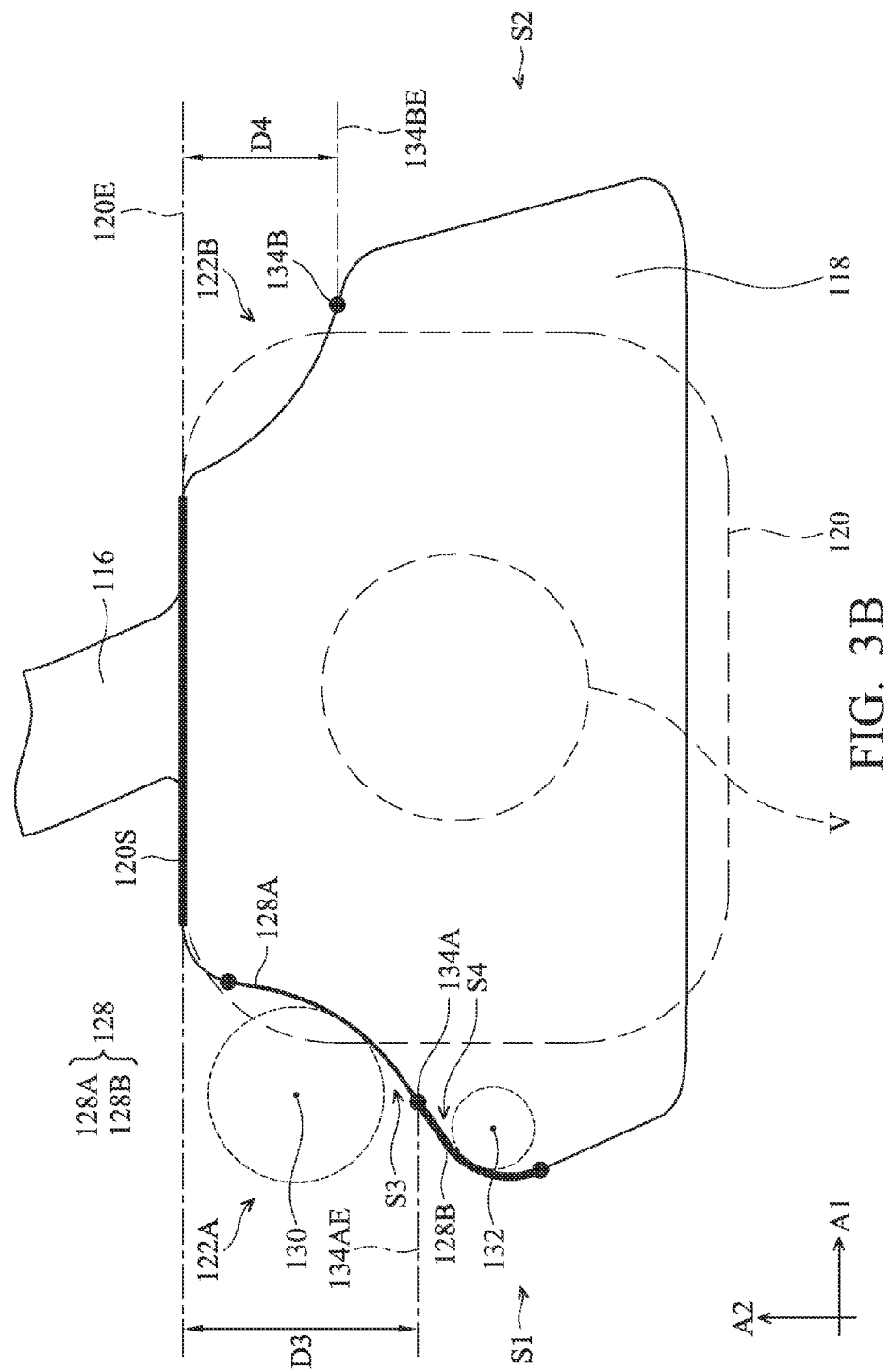
FIG. 3B is a partially enlarged figure of the array substrate in FIG. 2.

FIG. 3B shows the same connection portion 118 and the same portion of the first finger portion 116 as FIG. 3A. The connection portion 118 and the portion of the first finger portion 116 is reproduced in FIG. 3B in order to illustrate the technical features of the present disclosure more clearly. As shown in FIG. 3B, the connection portion 118 has a first inflection point 134A at the first side S1 and a second inflection point 134B at the second side S2. The distance D3 between the first inflection point 134A and the edge 120S is greater than the distance D4 between the second inflection point 134B and the edge 120S along the direction A2 which is perpendicular to the gate-line-extending direction A1. This feature may further decrease the amount of the liquid-crystal molecules having the alignment direction different from most liquid-crystal molecules to increase the liquid-crystal efficiency and decrease the brightness non-uniformity that deteriorates the display quality.

In particular, the inflection point is the point where the center of curvature which located at the concave side of the curve changes from one side of the curve to the other side. Take the side of the connection portion 118 at the first side S1 for example, the portion of this side which is closer to the edge 120S has the first line segment 128A (namely the bold line pointed by reference numeral 128A in FIG. 3B) which has a concavity outward to the outer side S3 of the connection portion 118. The portion of this side which is farther away from the edge 120S has the second line segment 128B (namely the bold line pointed by reference numeral 128B in FIG. 3B) which has a concavity inward to the inner side S4 of the connection portion 118. The first line segment 128A and second line segment 128B compose the line segment 128. The inner side S4 is opposite to the outer side S3. In other words, the inner side S4 and outer side S3 are the opposite sides of the line segment 128. In addition, the center of curvature is the centre of a circle which is tangent to a point on the curve and has the same curvature radius with this point. In other words, the center of curvature is the point derived by extending from a point on the curve toward the concavity by the distance of the curvature radius of that point and along the direction perpendicular to the tangent direction of that point.

As shown in FIG. 3B, the first line segment 128A and second line segment 128B are both curve lines. The center of curvature of any point (for example the center of curvature 130) on the first line segment 128A is located at the outer side S3 of the first line segment 128A or line segment 128, and the center of curvature of any point (for example the center of curvature 132) on the second line segment 128B is located at the inner side S4 of the second line segment 128B or line segment 128. The point where the center of curvature of the side of the connection portion 118 including line segment 128 changes from the outer side S3 to the inner side S4 is the first inflection point 134A of this side. In addition, the first inflection point 134A is also the connection point of the first line segment 128A and second line segment 128B. Similarly, the second inflection point 134B of the connection portion 118 at the second side S2 is defined by the same method.

In addition, the extension line 134AE is the line which is parallel to the gate-line-extending direction A1 and passes through the first inflection point 134A. The distance D3 between the first inflection point 134A and the edge 120S is the distance between the extension line 134AE and the extension line 120E along the direction A2 which is perpendicular to the gate-line-extending direction A1. Similarly, the extension line 134BE is the line which is parallel to the gate-line-extending direction A1 and passes through the second inflection point 134B. The distance D4 between the second inflection point 134B and the edge 120S is the distance between the extension line 134BE and the extension line 120E along the direction A2 which is perpendicular to the gate-line-extending direction A1.

As illustrated in FIG. 3B, the distance D3 between the first inflection point 134A of the connection portion 118 and the edge 120S being greater than the distance D4 between the second inflection point 134B and the edge 120S means that the area of the portion of the connection portion 118 at the first side S1 is smaller than the area of the portion of the connection portion 118 at the second side S2. Therefore, the amount of the liquid-crystal molecules having the alignment direction different from most liquid-crystal molecules may be decreased to increase the liquid-crystal efficiency and the brightness of the display panel when displaying images and decrease the brightness non-uniformity to improve the display quality.

Figure 3C:
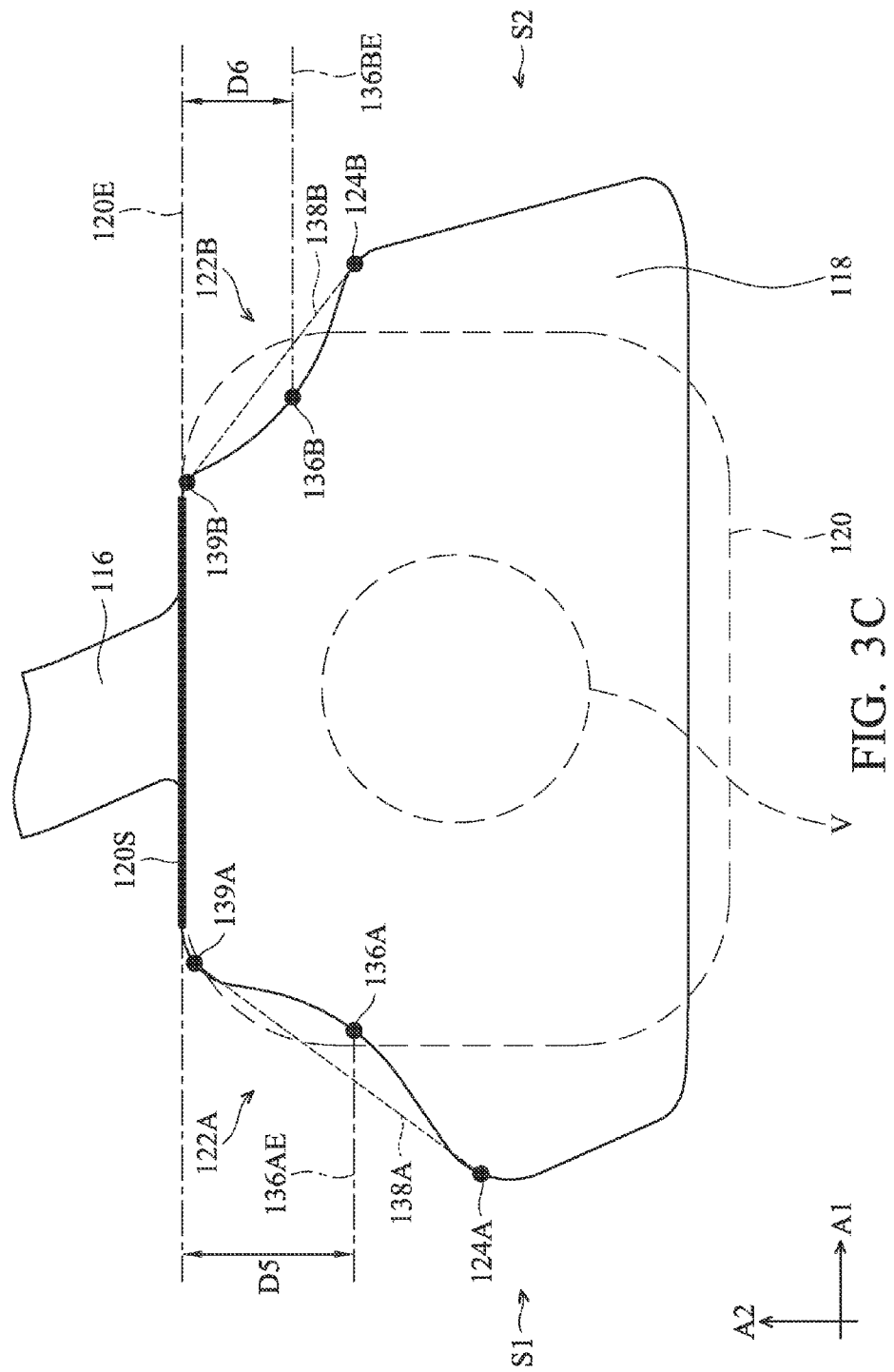
FIG. 3C is a partially enlarged figure of the array substrate in FIG. 2.

FIG. 3C shows the same connection portion 118 and the same portion of the first finger portion 116 as FIGS. 3A and 3B. The connection portion 118 and the portion of the first finger portion 116 is reproduced in FIG. 3C in order to illustrate the technical features of the present disclosure more clearly. As illustrated in FIG. 3C, the distance D5 between a most-concave point 136A of the first concavity 122A of the connection portion 118 and the edge 120S is greater than the distance D6 between a most-concave point 136B of the second concavity 122B and the edge 120S along the direction A2 perpendicular to the gate-line-extending direction A1. This feature may further decrease the amount of the liquid-crystal molecules having the alignment direction different from most liquid-crystal molecules to increase the liquid-crystal efficiency and decrease the brightness non-uniformity of the display quality.

In particular, the line segment 138A is the line between the first end point 124A which is away from the edge 120S in the first concavity 122A and the top end point 139A which is adjacent to the edge 120S. The most-concave point 136A of the first concavity 122A is the point on the first concavity 122A which is the greatest distance from the line segment 138A along the direction perpendicular to the line segment 138A. Similarly, the line segment 138B is the line between the second end point 124B which is away from the edge 120S in the second concavity 122B and the top end point 139B which is adjacent to the edge 120S. The most-concave point 136B of the second concavity 122B is the point on the second concavity 122B which has the greatest distance to the line segment 138B along the direction perpendicular to the line segment 138B.

In addition, the extension line 136AE is the line which is parallel to the gate-line-extending direction A1 and passes through the most-concave point 136A of the first concavity 122A. The distance D5 between the most-concave point 136A of the first concavity 122A and the edge 120S refers to the distance between the extension line 136AE and the extension line 120E along the direction A2 which is perpendicular to the gate-line-extending direction A1. Similarly, the extension line 136BE is the line which is parallel to the gate-line-extending direction A1 and passes through the most-concave point 136B of the second concavity 122B. The distance D6 between the most-concave point 136B of the second concavity 122B and the edge 120S refers to the distance between the extension line 136BE and the extension line 120E along the direction A2 which is perpendicular to the gate-line-extending direction A1.

As illustrated in FIG. 3C, the distance D5 between the most-concave point 136A of the first concavity 122A of the connection portion 118 and the edge 120S being greater than the distance D6 between the most-concave point 136B of the second concavity 122B and the edge 120S means that the area of the portion of the connection portion 118 at the first side S1 is smaller than the area of the portion of the connection portion 118 at the second side S2. Therefore, the amount of the liquid-crystal molecules having the alignment direction different from most liquid-crystal molecules may be decreased to increase the liquid-crystal efficiency and the brightness of the display panel when displaying images and decrease the brightness non-uniformity to improve the display quality.

Figure 3D:
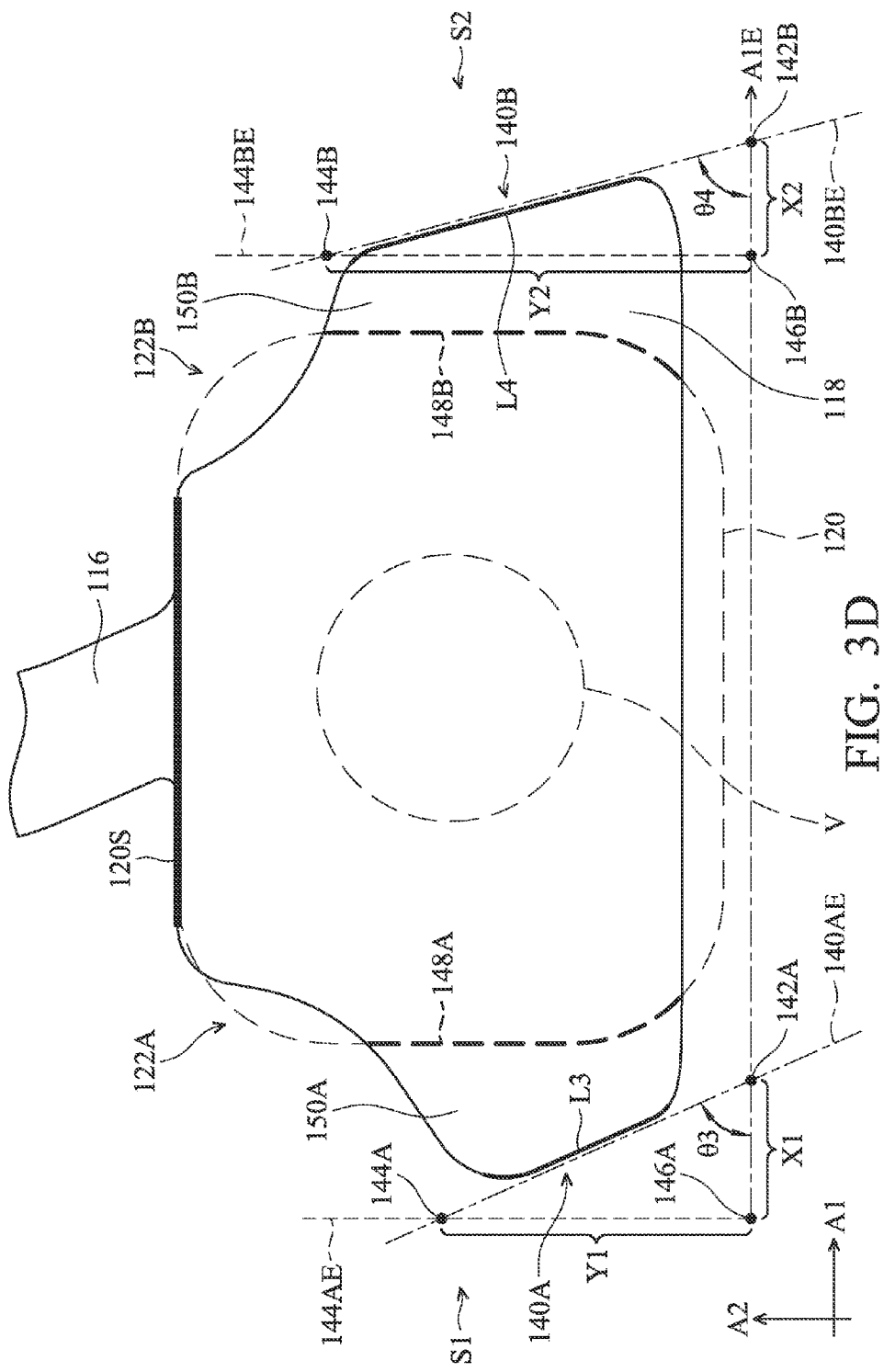
FIG. 3D is a partially enlarged figure of the array substrate in FIG. 2.

FIG. 3D shows the same connection portion 118 and the same portion of the first finger portion 116 as FIGS. 3A, 3B and 3C. The connection portion 118 and the portion of the first finger portion 116 is reproduced in FIG. 3D in order to illustrate the technical features of the present disclosure more clearly. As illustrated in FIG. 3D, the connection portion 118 has a first margin 140A connecting the first concavity 122A at the first side S1 and a second margin 140B connecting the second concavity 122B at the second side S2. With respect to the gate-line-extending direction A1, the absolute slope value of the first margin 140A is different from that of the second margin 140B. In addition, in one embodiment, the absolute slope value of the first margin 140A is smaller than that of the second margin 140B. This feature may further decrease the amount of the liquid-crystal molecules having the alignment direction different from most liquid-crystal molecules to increase the liquid-crystal efficiency and decrease the brightness non-uniformity of the display quality.

In the embodiment shown in FIG. 3D, the angle θ3 between the first margin 140A of the connection portion 118 and the gate-line-extending direction A1 is not 90 degrees, and the angle θ4 between the second margin 140B and the gate-line-extending direction A1 is also not 90 degrees. The aforementioned absolute slope value of the first margin 140A, the absolute slope value of the second margin 140B, angle θ3 and angle θ4 may be defined by the first margin 140A, the second margin 140B and any line parallel to the gate-line-extending direction A1 (for example the extension line A1E).

In particular, the extension line 140AE of the first margin 140A intersects the extension line A1E at an intersection point 142A. The line 144AE refers to the line which is parallel to the direction A2 and passes through a point 144A on the extension line 140AE. The line 144AE intersects the extension line A1E at an intersection point 146A. The distance between the intersection point 146A and the intersection point 142A is the distance X1, and the distance between the intersection point 146A and the point 144A is the distance Y1. The aforementioned absolute slope value of the first margin 140A with respect to the gate-line-extending direction A1 is the value derived by dividing the distance Y1 by the distance X1 (namely Y1/X1).

Similarly, the extension line 140BE of the second margin 140B intersects the extension line A1E at an intersection point 142B. The line 144BE refers to the line which is parallel to the direction A2 and passes through a point 144B on the extension line 140BE. The line 144BE intersects the extension line A1E at an intersection point 146B. The distance between the intersection point 146B and the intersection point 142B is the distance X2, and the distance between the intersection point 146B and the point 144B is the distance Y2. The aforementioned absolute slope value of the second margin 140B with respect to the gate-line-extending direction A1 is the value derived by dividing the distance Y2 by the distance X2 (namely Y2/X2).

In addition, the angle θ3 refers to the acute angle between the first margin 140A (or the extension line 140AE thereof) and the gate-line-extending direction A1. The angle θ4 refers to the acute angle between the second margin 140B (or the extension line 140BE thereof) and the gate-line-extending direction A1. Since the absolute slope value of the first margin 140A of the connection portion 118 is smaller than that of the second margin 140B, the angle θ4 is greater than the angle θ3.

As shown in FIG. 3D, the absolute slope value of the first margin 140A of the connection portion 118 being smaller than that of the second margin 140B (or the angle θ4 being greater than the angle θ3) means that the area of the portion of the connection portion 118 at the first side S1 is smaller than the area of the portion of the connection portion 118 at the second side S2. Therefore, the amount of the liquid-crystal molecules having the alignment direction different from most liquid-crystal molecules may be decreased to increase the liquid-crystal efficiency and the brightness of the display panel when displaying images and decrease the brightness non-uniformity to improve the display quality.

In addition, still referring to FIG. 3D, the length L3 of the first margin 140A (namely the length of the bold line labelled as the reference numeral L3 in FIG. 3D) may be smaller than the length L4 of the second margin 140B (namely the length of the bold line labelled as the reference numeral L4 in FIG. 3D), this means that the area of the portion of the connection portion 118 at the first side S1 is smaller than the area of the portion of the connection portion 118 at the second side S2. Therefore, the amount of the liquid-crystal molecules having the alignment direction different from most liquid-crystal molecules may be decreased to increase the liquid-crystal efficiency and the brightness of the display panel when displaying images and decrease the brightness non-uniformity to improve the display quality.

Next, still referring to FIG. 3D, the opening 120 of the first electrode 106 (serving as a common electrode in this embodiment) has a first side edge 148A at the first side S1 and a second side edge 148B at the second side S2. The connection portion 118 of the second electrode 108 (serve as a pixel electrode in this embodiment) has a first region 150A outside the first side edge 148A (namely outside the bold line pointed by reference numeral 148A in FIG. 3D). The connection portion 118 has a second region 150B outside the second side edge 148B has a second region 150B outside the second side edge 148B (namely outside the bold line pointed by reference numeral 148B in FIG. 3D). The first region 150A has a smaller area than the second region 150B.

In particular, the portion of the connection portion 118 which does not overlap with the opening 120 may be divided into two portions. The portion adjacent to the first side S1 is located outside the first side edge 148A of the opening 120 and is referred to as the first region 150A (closer to the left side of the figure). The portion adjacent to the second side S2 is located outside the second side edge 148B of the opening 120 and is referred to as the second region 150B (closer to the right side of the figure).

As illustrated in FIG. 3D, since the first region 150A of connection portion 118 which is closer to the first side S1 has a smaller area than the second region 150B which is closer to the second side S2, the amount of the liquid-crystal molecules having the alignment direction different from most liquid-crystal molecules may be decreased to increase the liquid-crystal efficiency and the brightness of the display panel when displaying images and decrease the brightness non-uniformity to improve the display quality.

In addition, although the above description merely illustrates embodiments with the pixel electrode having only one finger portion, the pixel electrode may have two or more finger portions as shown in the embodiment of FIG. 4. It should be noted that the exemplary embodiments shown in FIG. 1A-3D are merely for the purpose of illustration, and the inventive concept may be embodied in various forms without being limited to the exemplary embodiments.

FIG. 4 is a top view of a pixel electrode of an array substrate in accordance with another embodiment of the present disclosure. As shown in FIG. 4, the second electrode 108 serving as a pixel electrode may further include a second finger portion 152 substantially parallel to the first finger portion 116 and a slant slit 154 disposed between the first finger portion 116 and the second finger portion 152. The second electrode 108 having two finger portions may further increase the liquid-crystal efficiency and the brightness of the display panel when displaying images.

In addition, although the above description merely illustrates embodiments with the first electrode being a common electrode and the second electrode being a pixel electrode, those skilled in the art will appreciate that the first electrode may be a pixel electrode with the second electrode being a common electrode. In other words, in the array substrate, the pixel electrode may be disposed over the substrate and the common electrode may be disposed over the pixel electrode.

In addition, the present disclosure also provides a display device 200 including the aforementioned array substrate 100 as shown in FIG. 5. The display device 200 in FIG. 5 includes the array substrate 100 of the present disclosure, an opposite substrate 202 disposed opposite to the array substrate 100 and a display medium 204 disposed between the array substrate 100 and the opposite substrate 202.

The opposite substrate 202 may be a color filter substrate, a transparent substrate, or any other suitable substrate. The color filter substrate may include a transparent substrate and a color filter layer disposed over the transparent substrate. The transparent substrate may include, but is not limited to, a glass substrate, a ceramic substrate, a plastic substrate, or any other suitable transparent substrate.

The display medium 204 may be a liquid-crystal material. The liquid-crystal material may include, but is not limited to, nematic liquid crystal, smectic liquid crystal, cholesteric liquid crystal, blue phase liquid crystal, or any other suitable liquid-crystal material.

The display device 200 may include, but is not limited to, a liquid-crystal display such as a thin film transistor liquid-crystal display. Alternatively, the liquid-crystal display may include, but is not limited to, a twisted nematic (TN) liquid-crystal display, a super twisted nematic (STN) liquid-crystal display, a double layer super twisted nematic (DSTN) liquid-crystal display, a vertical alignment (VA) liquid-crystal display, an in-plane switching (IPS) liquid-crystal display, a cholesteric liquid-crystal display, a blue phase liquid-crystal display, or any other suitable liquid-crystal display.

In summary, the embodiments of the present disclosure enlarge the concavity of the pixel electrode at specific side to substantially reduce the area of the portion of the connection portion at this side to decrease the amount of the liquid-crystal molecules having the alignment direction different from most liquid-crystal molecules at this specific side. Therefore, the liquid-crystal efficiency may be increased, which in turn increases the brightness of the display panel when displaying images, and the dark stripes and the bright stripes may be reduced to improve the display quality.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
   an array substrate, comprising:
   a substrate;
   a first electrode disposed over the substrate, wherein the first electrode has an opening and the opening has an edge parallel to a gate-line-extending direction; and
   a second electrode disposed over the first electrode, wherein the second electrode comprises:
   a first finger portion having a first side and a second side opposite to the first side, wherein a first outer edge of the first finger portion intersects the gate-line-extending direction at an acute angle at the first side, and a second outer edge of the first finger portion intersects the gate-line-extending direction at an obtuse angle at the second side; and
   a connection portion connecting the first finger portion at the edge, wherein the connection portion has a first width along the gate-line-extending direction adjacent to the edge, and the connection portion has a second width along the gate-line-extending direction away from the edge, wherein the first width is smaller than the second width,
   wherein the connection portion has a first concavity at the first side and a second concavity at the second side, and a length of the first concavity is greater than a length of the second concavity;
   an opposite substrate; and
   a display medium disposed between the array substrate and the opposite substrate.

2. The display device as claimed in claim 1, wherein the first concavity has a first end point away from the edge, and the second concavity has a second end point away from the edge, wherein a distance between the first end point and the edge is greater than a distance between the second end point and the edge along a direction perpendicular to the gate-line-extending direction.

3. The display device as claimed in claim 1, wherein the connection portion has a first margin connecting the first concavity at the first side and a second margin connecting the second concavity at the second side, wherein with respect to the gate-line-extending direction, an absolute slope value of the first margin is different from that of the second margin.

4. The display device as claimed in claim 1, wherein the opening has a first side edge at the first side and a second side edge at the second side, wherein the connection portion has a first region outside the first side edge and a second region outside the second side edge, and the first region has a smaller area than the second region.

5. A display device, comprising:
   an array substrate, comprising:
   a substrate;
   a first electrode disposed over the substrate, wherein the first electrode has an opening and the opening has an edge parallel to a gate-line-extending direction; and
   a second electrode disposed over the first electrode, wherein the second electrode comprises:
   a first finger portion having a first side and a second side opposite to the first side, wherein a first outer edge of the first finger portion intersects the gate-line-extending direction at an acute angle at the first side, and a second outer edge of the first finger portion intersects the gate-line-extending direction at an obtuse angle at the second side; and
   a connection portion connecting the first finger portion at the edge, wherein the connection portion has a first width along the gate-line-extending direction adjacent to the edge, and the connection portion has a second width along the gate-line-extending direction away from the edge, wherein the first width is smaller than the second width,
   wherein the connection portion has a first inflection point at the first side and a second inflection point at the second side, wherein a distance between the first inflection point and the edge is greater than a distance between the second inflection point and the edge along a direction perpendicular to the gate-line-extending direction;
   an opposite substrate; and
   a display medium disposed between the array substrate and the opposite substrate.

6. The display device as claimed in claim 5, wherein the connection portion has a first concavity at the first side and a second concavity at the second side, the first concavity has a first end point away from the edge, and the second concavity has a second end point away from the edge, wherein a distance between the first end point and the edge is greater than a distance between the second end point and the edge along the direction perpendicular to the gate-line-extending direction.

7. The display device as claimed in claim 6, wherein the connection portion has a first margin connecting the first concavity at the first side and a second margin connecting the second concavity at the second side, wherein with respect to the gate-line-extending direction, an absolute slope value of the first margin is different from that of the second margin.

8. The display device as claimed in claim 5, wherein the opening has a first side edge at the first side and a second side edge at the second side, wherein the connection portion has a first region outside the first side edge and a second region outside the second side edge, and the first region has a smaller area than the second region.

9. A display device, comprising:
   an array substrate, comprising:
   a substrate;
   a first electrode disposed over the substrate, wherein the first electrode has an opening and the opening has an edge parallel to a gate-line-extending direction; and
   a second electrode disposed over the first electrode, wherein the second electrode comprises:
   a first finger portion having a first side and a second side opposite to the first side, wherein a first outer edge of the first finger portion intersects the gate-line-extending direction at an acute angle at the first side, and a second outer edge of the first finger portion intersects the gate-line-extending direction at an obtuse angle at the second side; and
   a connection portion connecting the first finger portion at the edge, wherein the connection portion has a first width along the gate-line-extending direction adjacent to the edge, and the connection portion has a second width along the gate-line-extending direction away from the edge, wherein the first width is smaller than the second width,
   wherein the connection portion has a first concavity at the first side and a second concavity at the second side, wherein a distance between a most-concave point of the first concavity and the edge is greater than a distance between a most-concave point of the second concavity and the edge along a direction perpendicular to the extension direction of the gate line, an opposite substrate; and a display medium disposed between the array substrate and the opposite substrate.

10. The display device as claimed in claim 9, wherein the first concavity has a first end point away from the edge, and the second concavity has a second end point away from the edge, wherein a distance between the first end point and the edge is greater than a distance between the second end point and the edge along the direction perpendicular to the gate-line-extending direction.

11. The display device as claimed in claim 9, wherein the connection portion has a first margin connecting the first concavity at the first side and a second margin connecting the second concavity at the second side, wherein with respect to the gate-line-extending direction, an absolute slope value of the first margin is different from that of the second margin.

12. The display device as claimed in claim 11, wherein the absolute slope value of the first margin is smaller than that of the second margin.

13. The display device as claimed in claim 11, wherein the first margin has a shorter length than the second margin.

14. The display device as claimed in claim 11, wherein an angle between the first margin and the gate-line-extending direction is not 90 degrees, and an angle between the second margin and the gate-line-extending direction is not 90 degrees.

15. The display device as claimed in claim 9, wherein the second electrode further comprises:

a second finger portion substantially parallel to the first finger portion; and a slant slit disposed between the first finger portion and the second finger portion.

16. The display device as claimed in claim 9, wherein the opening has a first side edge at the first side and a second side edge at the second side, wherein the connection portion has a first region outside the first side edge and a second region outside the second side edge, and the first region has a smaller area than the second region.

17. The display device as claimed in claim 9, wherein the connection portion further comprises an upper portion adjacent to the edge and a lower portion away from the edge, wherein the upper portion has the first width along the gate-line-extending direction, and the lower portion has the second width along the gate-line-extending direction.

18. The display device as claimed in claim 17, wherein the first concavity and the second concavity of the connection portion are both disposed in the upper portion of the connection portion.

19. The display device as claimed in claim 17, wherein the first concavity and the second concavity of the connection portion are not disposed in the lower portion of the connection portion.

* * * * *